US009685908B1

(12) United States Patent
Lee et al.

(10) Patent No.: US 9,685,908 B1
(45) Date of Patent: Jun. 20, 2017

(54) VARIABLE CAPACITOR USED IN INTEGRATED CIRCUIT OF DIFFERENTIAL STRUCTURE

(71) Applicant: SOONGSIL UNIVERSITY RESEARCH CONSORTIUM TECHNO-PARK, Seoul (KR)

(72) Inventors: Mi Lim Lee, Yangju-si (KR); Ga Yeon Ko, Ansan-si (KR); Chang Kun Park, Gwangmyeong-si (KR)

(73) Assignee: SOONGSIL UNIVERSITY RESEARCH CONSORTIUM TECHNO-PARK, Seoul (KR)

( * ) Notice: Subject to any disclaimer, the term of this patent is extended or adjusted under 35 U.S.C. 154(b) by 0 days.

(21) Appl. No.: 15/207,470

(22) Filed: Jul. 11, 2016

(30) Foreign Application Priority Data

Mar. 16, 2016 (KR) .................. 10-2016-0031538

(51) Int. Cl.
  *H03B 5/12* (2006.01)
(52) U.S. Cl.
  CPC ........... *H03B 5/124* (2013.01); *H03B 5/1212* (2013.01)
(58) Field of Classification Search
  CPC .................. H03B 5/124; H03B 5/1212
  See application file for complete search history.

(56) References Cited

U.S. PATENT DOCUMENTS

| 7,569,912 B2* | 8/2009 | Sze ..................... H01L 27/0808 257/296 |
| 9,166,068 B2* | 10/2015 | Shah ...................... H01L 29/93 |
| 9,214,512 B2* | 12/2015 | Marino ............... H01L 29/0615 |
| 2005/0133886 A1* | 6/2005 | Kao .................... H01L 27/0808 257/534 |
| 2005/0280061 A1* | 12/2005 | Lee ..................... H01L 21/2007 257/296 |
| 2015/0325676 A1* | 11/2015 | Shah ....................... H01L 29/93 438/379 |

FOREIGN PATENT DOCUMENTS

KR  10-0645928 B1  11/2006

* cited by examiner

*Primary Examiner* — Ida M Soward
(74) *Attorney, Agent, or Firm* — Revolution IP, PLLC

(57) ABSTRACT

The present invention related to a varactor used in an integrated circuit of a differential structure. An exemplary embodiment of the present invention provides a variable capacitor connected between first and second signal lines which are differential signal lines included in an integrated circuit of a differential structure, including: a plurality of N-type semiconductors separately arranged; one or more P-type semiconductors disposed between the N-type semiconductors to make first and second PN junctions with N-type semiconductors contacting upper and lower portions thereof and to receive a control voltage, wherein, among the N-type semiconductors, first N-type semiconductors corresponding to (2n−1)-th (n being a positive integer) are connected with the first signal line, and second N-type semiconductors corresponding to 2n-th are connected with the second signal line, and parasitic capacitances of the first and second PN junctions are varied by adjusting the control voltage.

5 Claims, 7 Drawing Sheets

FIG. 6
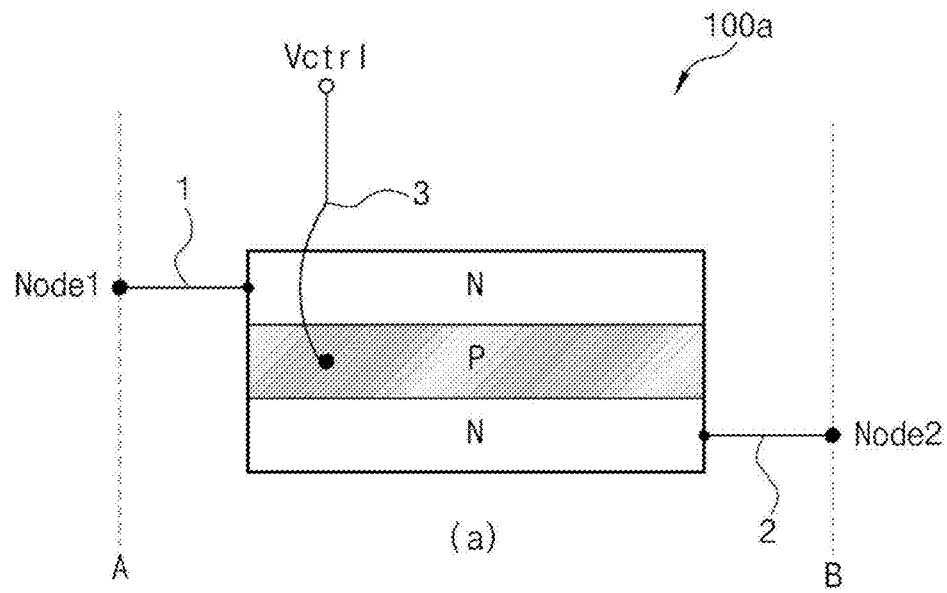
(a)
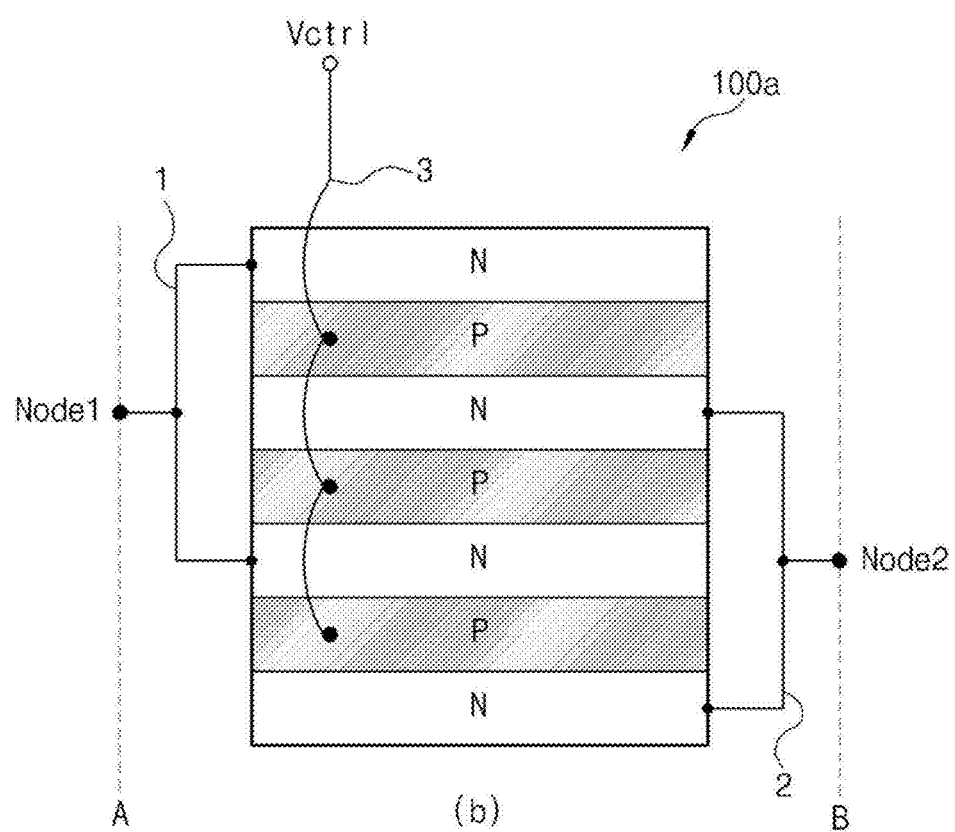
(b)

FIG. 7
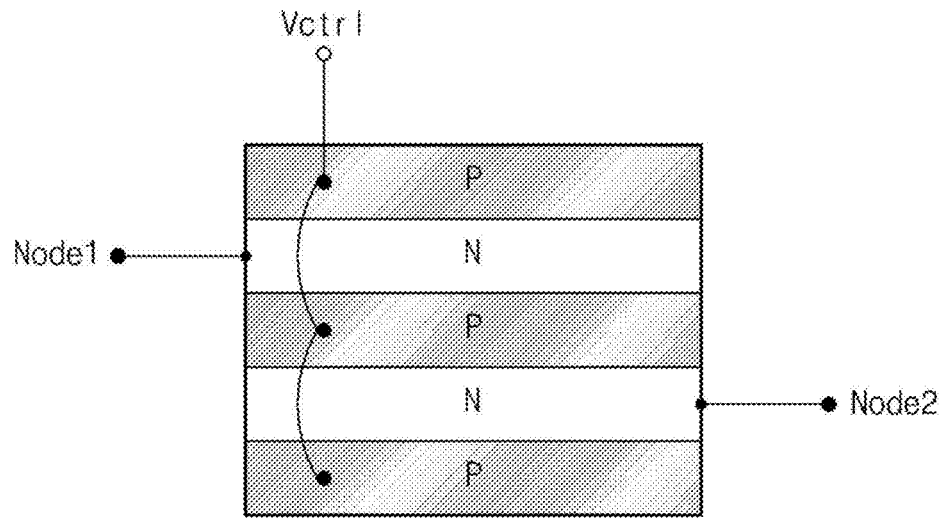
(a)
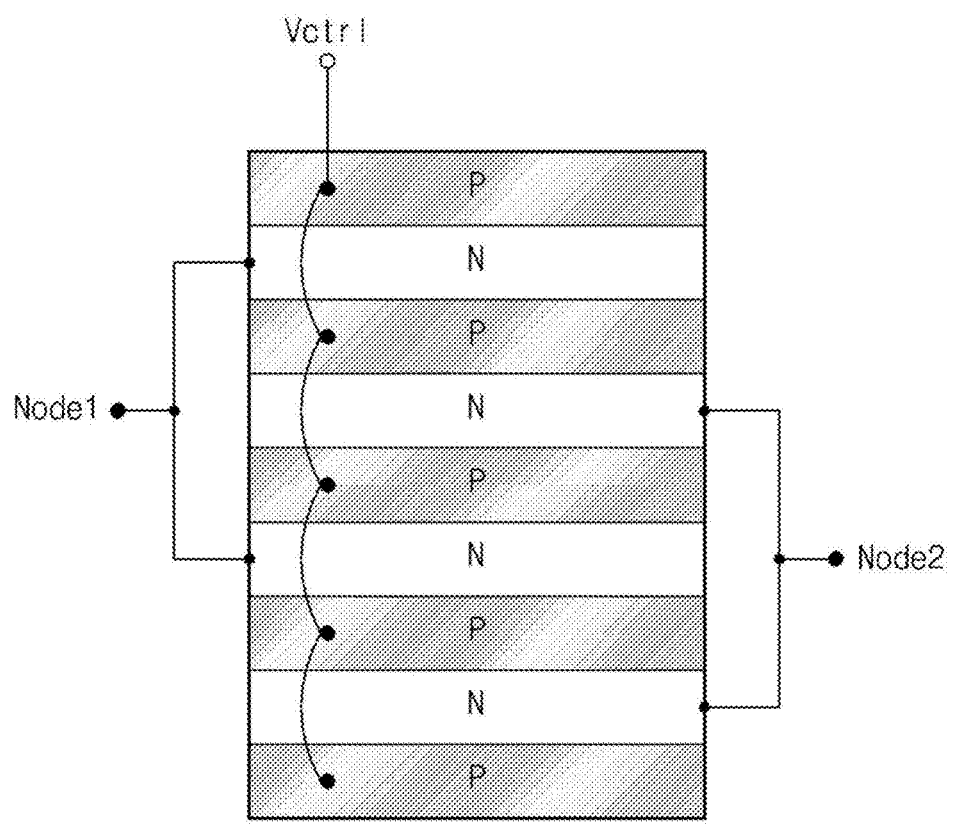
(b)

VARIABLE CAPACITOR USED IN INTEGRATED CIRCUIT OF DIFFERENTIAL STRUCTURE

CROSS-REFERENCE TO RELATED APPLICATION

This application claims priority to and the benefit of Korean Patent Application No. 10-2016-0031538 filed in the Korean Intellectual Property Office on Mar. 16, 2016, the entire contents of which are incorporated herein by reference.

BACKGROUND OF THE INVENTION (a) Field of the Invention

The present invention related to a variable capacitor used in an integrated circuit of a differential structure, and more particularly, to a variable capacitor capable of reducing an area required for an integrated circuit and reducing a production cost thereof.

(b) Description of the Related Art

In general, a structure in which two variable capacitors formed to be symmetrical to each other are connected with each other is employed in a high-frequency integrated circuit that is operated by using a differential structure.

FIG. 1 illustrates a structure of a voltage controlled oscillator (VCO) that is operated by using a differential structure. Among high-frequency integrated circuits each of which is operated by using the differential structure, the voltage controlled oscillator is one of the integrated circuits in which a variable capacitor is most frequently used. FIG. 1 shows a cross-coupled VCO, which includes an LC tank 11 for determining an oscillation frequency, a variable capacitor (e.g., a varactor) 12 for varying an oscillation frequency, and an amplification stage 13 for continuously oscillating an oscillator.

In general, an RF front-end is not operated on only one frequency, and has a specific operating frequency range and is required to vary operating frequencies according to a wireless communication environment. The operating frequencies may be varied by adjusting values of elements constituting an integrated circuit. For example, a capacitance value may be employed. In the case of FIG. 1, the varactor 12 which facilitates adjustment of C values as well as the LC tank 11 for determining the oscillation frequency are essentially used. The varactor 12 is mainly formed by using diodes or MOSFETs. For convenience of illustration, FIG. 1 illustrates the case of the diodes.

FIG. 2 illustrates a variable capacitor employing diodes shown in FIG. 1. As shown in FIG. 1, the variable capacitor 12 is connected between two differential signal lines formed in an integrated circuit of a differential structure, and employs two diodes 21n and 21p. Anodes of the two diodes 21n and 21p are connected with each other. A source voltage VDD is applied to cathode nodes 22n and 22p of the diodes 21n and 21p, and a control voltage Vctrl for controlling a parasitic capacitance component is applied to anode nodes thereof.

In general, the control voltage Vctrl is generated to be lower than the source voltage VDD. A lower voltage is applied to anode nodes of the two diodes than that of cathode nodes thereof, and resultantly a reverse bias is applied to both of the two diodes. Sizes of depletion regions formed in the two diodes are adjusted depending on a magnitude of the reverse bias, thereby varying a parasitic capacitance. Herein, virtual ground nodes are formed in the anode nodes at which the two diodes are connected. The cathode nodes 22n and 22p of the two diodes respectively serve as differential outputs (negative output and positive output) of VCO, which are connected with differential buffers.

FIG. 3 illustrates a case that the variable capacitor shown in FIG. 1 is formed by using MOSFETs. When the MOSETs are employed, both of NMOSs and PMOSs may be used. For convenience of description, a method employing the PMOSs will be described hereinafter. However, a variable capacitor formed by using a method employing the NMOSs is operated in a same method as the case of the method employing the PMOSs.

As shown in FIG. 3, two PMOSs 31n and 31p are employed. Sources S and drains D thereof are connected with each other, and connection points thereof serve as virtual ground nodes of an entire circuit. A control voltage Vctrl is applied to the virtual ground nodes to adjust a capacitance of the variable capacitor. A varactor is formed by using a same principle as the case of FIG. 2, in which a gate capacitance is varied depending on magnitudes of a source voltage VDD applied to a gate G and the control voltage Vctrl applied to the drain and the source of the corresponding PMOS in the two PMOSs 31n and 31p.

FIG. 4 illustrates a concept of an actual layout of a variable capacitor formed by using diodes shown in FIG. 2. As shown in FIG. 4, in the two diodes 21n and 21p shown in FIG. 2, a plurality of PN junctions are laid out in a finger form. Herein, the finger form indicates a type of a semiconductor disposing method for improving an area efficiency on an integrated circuit by repeatedly using a plurality of PN junctions. For example, each of the diodes 21n and 21p shown in FIG. 4 may have 8 fingers.

When the circuit diagram shown in FIG. 2 corresponds to a semiconductor layout shown in FIG. 4, N regions of a first diode 21n formed of a plurality of PN junctions are connected with each other to form a node 22n, and P regions thereof are connected with each other to be connected with the control voltage Vctrl. Similarly, N regions of a second diode 21p are connected with each other to form a node 22p, and P regions thereof are connected with each other to be connected with the control voltage Vctrl.

FIG. 5 illustrates a concept of an actual layout of a variable capacitor formed by using PMOSs shown in FIG. 3. As shown in FIG. 5, in the PMOSs 31n and 31p shown in FIG. 3, a plurality of unit PMOSs are laid out in a finger form. In this case, the finger form indicates a type of a semiconductor disposing method for improving an area efficiency on an integrated circuit by repeatedly a plurality of unit PMOSs. For example, each of the PMOSs 31n and 31p shown in FIG. 5 may have 4 fingers.

When the circuit diagram shown in FIG. 3 corresponds to a semiconductor layout shown in FIG. 5, gates G of a first PMOS 31n are connected with each other to form a node 32n, and drains D and sources S are connected with each other to be connected with the control voltage Vctrl. Similarly, gates G of a second PMOS 31p are connected with each other to form a node 32p, and drains D and sources S are connected with each other to be connected with the control voltage Vctrl.

Although the case of forming the varactor by using the PMOSs has been described in the above description, the same layout and description are applied to a case of using NMOSs.

The variable capacitor formed as such is most frequently used in the VCO. In the case of the VCO, the variable capacitor plays an important role to generate carrier frequencies on a high-frequency system. An undesired resistance component exists in an internal circuit portion of the VCO causes noise generation, and phase noise which is one of main performance indexes of the VCO may be degraded.

Various factors which degrade the phase noise of the VCO exist, but one of the factors is a varactor. As described above, the varactor is essential to vary the operating frequencies of the VCO. However, as shown in FIG. 4 and FIG. 5, the varactor has more complex structure than that of a general MIM capacitor and uses a depletion region. Accordingly, the varactor has a relative low quality factor. Herein, the low quality factor indicates a large parasitic resistance component and a high power leakage. Accordingly, it is essential to minimize this parasitic resistance component in the varactor.

However, according to Related Art, a desired parasitic resistance component is generated in not only elements constituting a varactor by layout complexity on an integrated circuit and but also metal lines of interconnection lines which connect the diodes 21n and 21p and PMOSs 31n and 31p with each other as shown in FIG. 4 and FIG. 5.

Background techniques of the prevent invention are disclosed in Korea Patent No. 0645928 (published on Nov. 14, 2006)

SUMMARY OF THE INVENTION

The present invention has been made in an effort to provide a variable capacitor capable of reducing an area required for an integrated circuit and reducing a production cost An exemplary embodiment of the present invention provides a variable capacitor connected between first and second signal lines which are differential signal lines included in an integrated circuit of a differential structure, including: a plurality of N-type semiconductors separately arranged; one or more P-type semiconductors disposed between the N-type semiconductors to make first and second PN junctions with N-type semiconductors contacting upper and lower portions thereof and to receive a control voltage, wherein, among the N-type semiconductors, first N-type semiconductors corresponding to (2n−1)-th (n being a positive integer) are connected with the first signal line, and second N-type semiconductors corresponding to 2n-th are connected with the second signal line, and parasitic capacitances of the first and second PN junctions are varied by adjusting the control voltage.

The first N-type semiconductors may be connected with each other through first metal lines, the second N-type semiconductors may be connected with each other through second metal lines, and the P-type semiconductors may be connected with each other through third metal lines.

P-type semiconductors may be additionally bonded to outermost of the N-type semiconductors to receive the control voltage.

An exemplary embodiment of the present invention provides a variable capacitor connected between first and second signal lines which are differential signal lines included in an integrated circuit of a differential structure, including: a plurality of P-type semiconductors separately arranged; one or more N-type semiconductors disposed between the P-type semiconductors to make first and second PN junctions with P-type semiconductors contacting upper and lower portions thereof and to receive a control voltage, wherein, among the P-type semiconductors, first P-type semiconductors corresponding to (2n−1)-th (n being a positive integer) are connected with the first signal line, and second P-type semiconductors corresponding to 2n-th are connected with the second signal line, and parasitic capacitances of the first and second PN junctions are varied by adjusting the control voltage.

The first P-type semiconductors may be connected with each other through first metal lines, the second P-type semiconductors may be connected with each other through second metal lines, and the N-type semiconductors may be connected with each other through third metal lines.

N-type semiconductors may be additionally bonded to outermost of the P-type semiconductors to receive the control voltage.

An exemplary embodiment of the present invention provides a variable capacitor connected between first and second signal lines which are differential signal lines included in an integrated circuit of a differential structure and including first and second transistors coupled thereto, including: a plurality of semiconductors separately arranged to receive a control voltage from an outside, and corresponding to a source region or a drain region; and a plurality of gate regions disposed between the semiconductors, wherein, among the gate regions, first gate regions corresponding to (2n−1)-th (n being a positive integer) serve as a gate of the first transistor and are connected with the first signal, and second gate regions corresponding to 2n-th serve as a gate of the second transistor and are connected with the second signal line, and the first and second transistors are formed such that positions of the source region and the drain region are opposite to each other based on the gate region thereof, and share source regions or drain regions through a semiconductor between the first and second gate regions.

The first gate regions may be connected with each other through first metal lines, the second gate regions may be connected with each other through second metal lines, and the semiconductors may be connected with each other through third metal lines.

When the first and second transistors are formed of PMOSs, the semiconductors may be formed as P-type semiconductors, and when the first and second transistors are formed of NMOSs, the semiconductors may be formed as N-type semiconductors.

When semiconductors disposed at an upper side and a lower side with respect to the first gate region of the first transistor respectively are the drain region and the source region, semiconductors disposed at an upper side and a lower side with respect to the second gate region of the second transistor may respectively be the source region and the drain region, and when semiconductors disposed at an upper side and a lower side with respect to the first gate region of the first transistor respectively are the source region and the drain region, semiconductors disposed at an upper side and a lower side with respect to the second gate region of the second transistor may respectively be the drain region and the source region.

With the variable capacitor applied to the integrated circuit of the differential structure according to the exemplary embodiments of the present invention, it is possible to reduce an area required for the integrated circuit and suppress a parasitic capacitance component from being generated by forming connection areas of virtual ground portions at which two variable capacitors formed on the integrated circuit of the differential structure to be symmetrical to each other are met to be shared. Accordingly, a production cost thereof can be reduced, and noise generation of the integrated circuit using the variable capacitor can be minimized.

BRIEF DESCRIPTION OF THE DRAWINGS

FIG. 6 illustrates a layout of a variable capacitor using a PN junction according to a first exemplary embodiment of the present invention.

FIG. 7 illustrates a case that a P-type semiconductor is added into an outermost of the variable capacitor shown in FIG. 6.

DETAILED DESCRIPTION OF THE EMBODIMENTS

Figure 1:
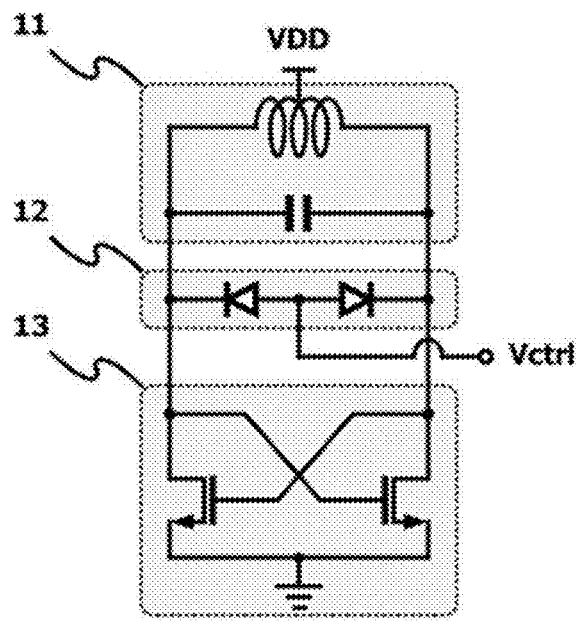
FIG. 1 illustrates a structure of a voltage controlled oscillator that is operated by using a differential structure.
Figure 2:
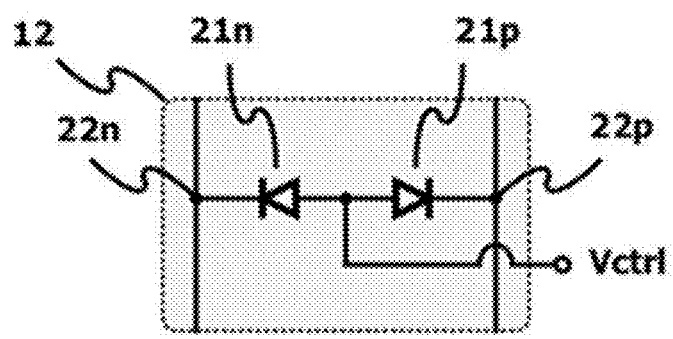
FIG. 2 illustrates a varactor employing diodes shown in FIG. 1.
Figure 3:
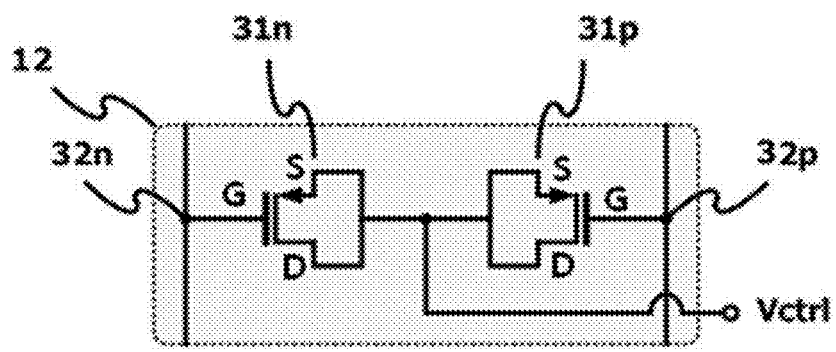
FIG. 3 illustrates a case that the variable capacitor shown in FIG. 1 is formed by using MOSFETs.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

The present invention related to a variable capacitor used in an integrated circuit of a differential structure, and the variable capacitor is disposed between a first signal line and a second signal line serving as differential signal lines included in the integrated circuit of the differential structure to serve as variable capacitance.

In general, among high-frequency integrated circuits, a voltage controlled oscillator (VCO) integrated circuit in which a variable capacitor is most frequently used needs not only a LC tank for generating an oscillation frequency shown in FIG. 1 but also a variable capacitor such as a varactor to vary the oscillation frequency.

Accordingly, the variable capacitor according to the present exemplary embodiment can replace a varactor which is employed in the VCO integrated circuit that is driven by using the differential structure. Application examples of the present invention may be varied, and may be applied to differential integrated circuits having various objects and forms which require variable capacitors.

Figure 8:
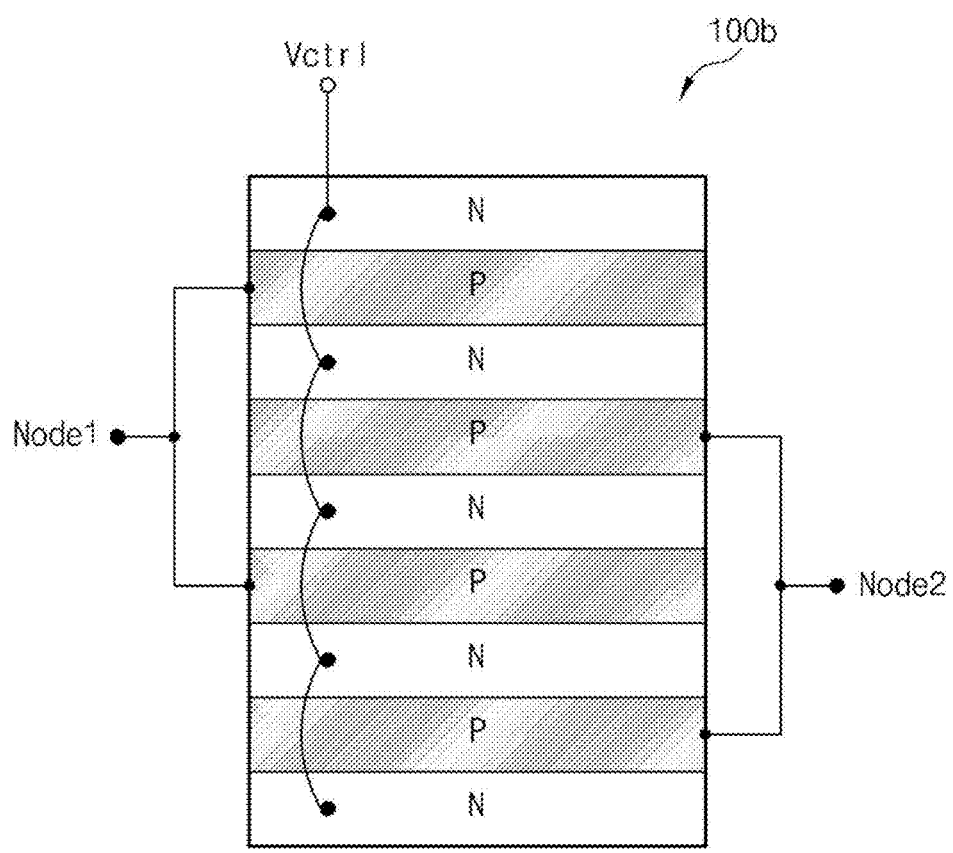
FIG. 8 illustrates a modification of the first exemplary embodiment of the present invention.
Figure 9:
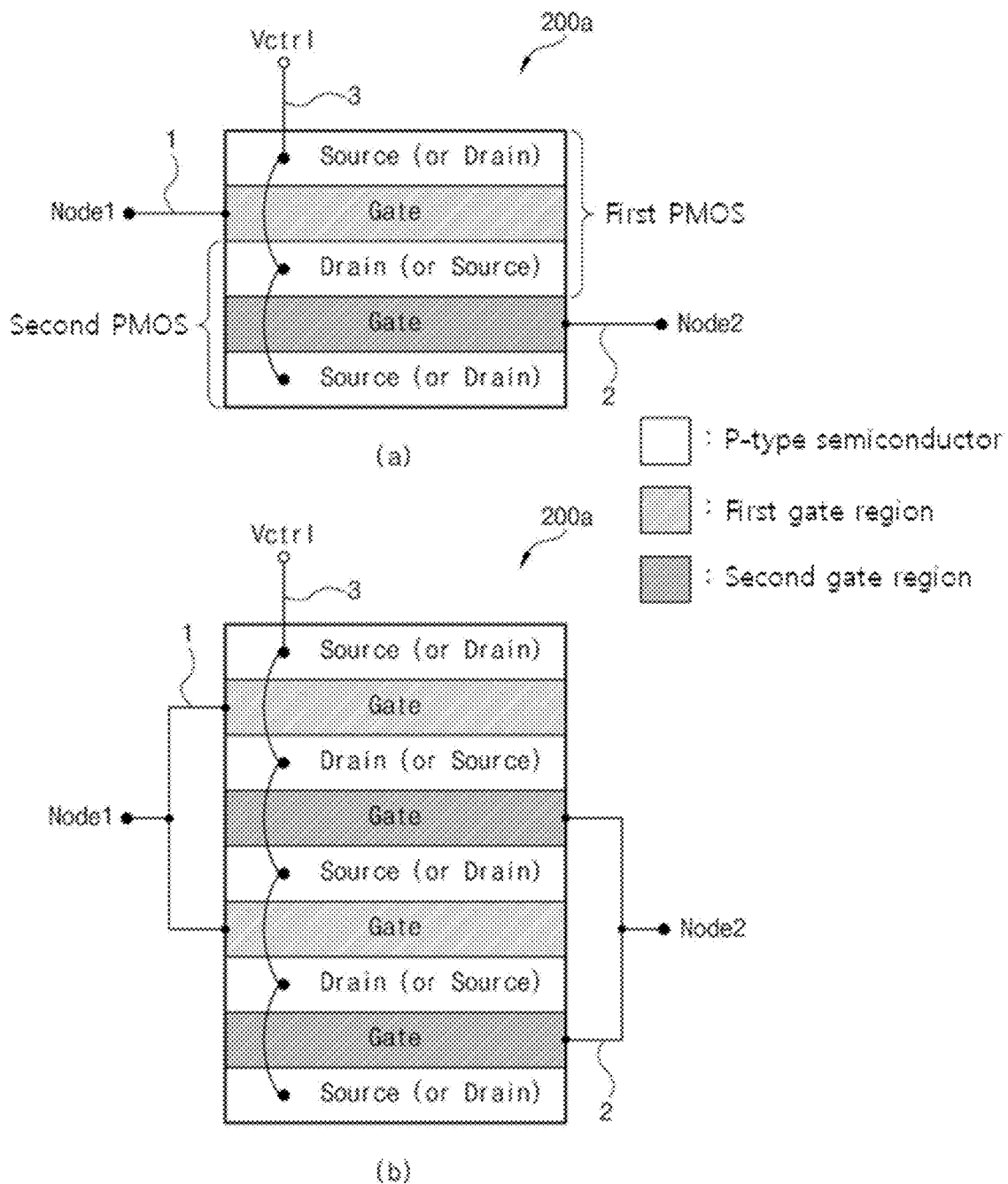
FIG. 9 illustrates a layout of a variable capacitor using MOSFETs according to a second exemplary embodiment of the present invention.
Figure 10:
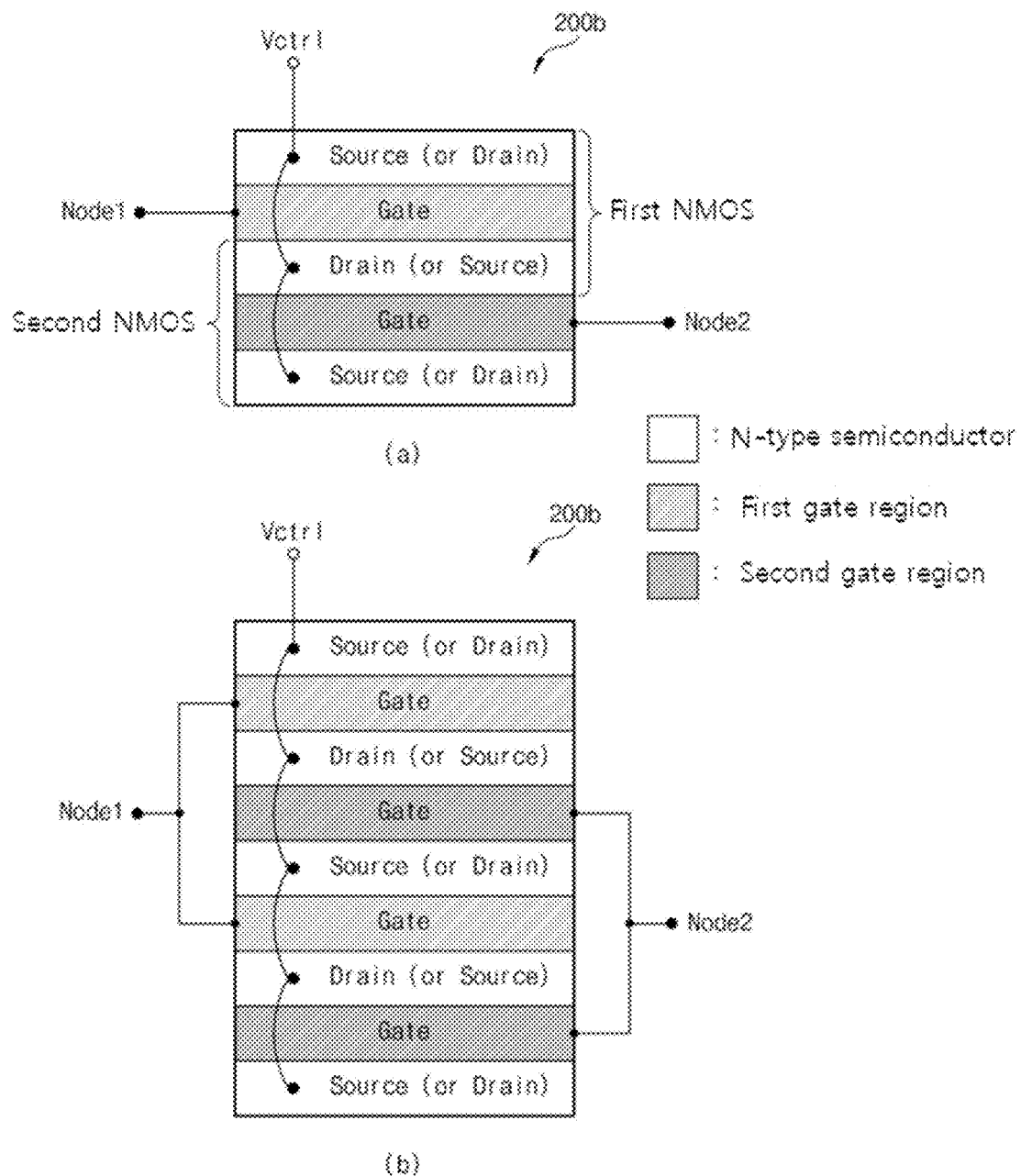
FIG. 10 illustrates a modification of FIG. 9.

An exemplary embodiment of the present invention suggests an actual layout of a variable capacitor that is applicable to an integrated circuit of a differential structure. According to the present exemplary embodiment, the variable capacitor is divided into two types, which are respectively realized by using PN junction as shown in FIG. 6 to FIG. 8 and by using transistors as shown in FIG. 9 and FIG. 10.

First, a layout of the variable capacitor realized by using the PN junction will be described. FIG. 6 illustrates a layout of a variable capacitor using PN junction according to a first exemplary embodiment of the present invention.

Referring to FIG. 6, the variable capacitor 100a according to the first exemplary embodiment of the present invention includes a plurality of N-type semiconductors N which are separately arranged and at least one P-type semiconductor P bonded between the N-type semiconductors N.

The variable capacitor shown in FIG. 6(a) has a simplest structure according to the first exemplary embodiment in which one P-type semiconductor is bonded between two N-type semiconductors, and the variable capacitor shown in FIG. 6(b) has a structure expanded from the structure shown in FIG. 6(a).

The variable capacitor 100a is connected between first and second signal lines A and B corresponding to differential signal lines in the integrated circuit of the differential structure. When the exemplary embodiment of the present invention is applied to the differential VCO shown in FIG. 1, the first signal line A may correspond to a positive output line among differential outputs, and the second signal line B may correspond to a negative output line, and vice versa. Further, as in the application example of the VCO shown in FIG. 1, the source voltage VDD is applied to the differential signal lines A and B. For convenience of description, in FIG. 6 and the following drawings, illustration of the first signal lines and second signal lines is omitted. Instead, a node 1 and a node 2 will be described.

As shown in FIG. 6, the P-type semiconductor P respectively constitutes first and second PN junctions together with the N-type semiconductors N contacting a lower portion and an upper portion of the P-type semiconductor P. Specifically, the P-type semiconductor P constitutes the first PN junction together with the N-type semiconductor contacting the upper portion thereof, and constitutes the second PN junction together with the N-type semiconductor contacting the lower portion thereof. The control voltage Vctrl is applied from an outside to the P-type semiconductor P.

As such, according to the first exemplary embodiment of the present invention, the variable capacitor 100a is operated by using a principle in which parasitic capacitances of the first and second PN junctions are varied by adjusting the control voltage Vctrl. Specifically, a reverse bias voltage may be generated by adjusting the control voltage Vctrl applied to the virtual ground node to be lower than the source voltage VDD flowing by two differential signal lines, thereby adjusting the capacitance.

In FIG. 6, the N-type semiconductors N may be divided into first N-type semiconductors and second N-type semiconductors. Among the N-type semiconductors N, the first N-type semiconductors disposed at odd-th ((2n−1)th; n being a positive integer) positions are connected with a first signal line A, and the second N-type semiconductors disposed at even-th (2n-th; n being a positive integer) positions are connected with a second signal line B.

In FIG. 6(a), a 1st N-type semiconductor at a top is connected with the first signal line A by the node 1, and a next 2nd N-type semiconductor is connected with the second signal line B by the node 2. Similarly, in FIGS. 6(b), 1st and 3th N-type semiconductors are connected with the first signal line A by the node 1, and 2nd and 4th N-type semiconductors are connected with the second signal line B by the node 2. Although not shown, the same principle is applied to a more expanded structure than that of FIG. 6(b).

Each connection is made by using metal lines. The first N-type semiconductors are connected with each other through first metal lines 1 to be connected with the node 1, and the second N-type semiconductor are connected with each other through second metal lines 2 to be connected with the node 2. Further, the P-type semiconductors are connected with each other through third metal lines 3 to be connected with a control voltage applying terminal (not illustrated).

Figure 4:
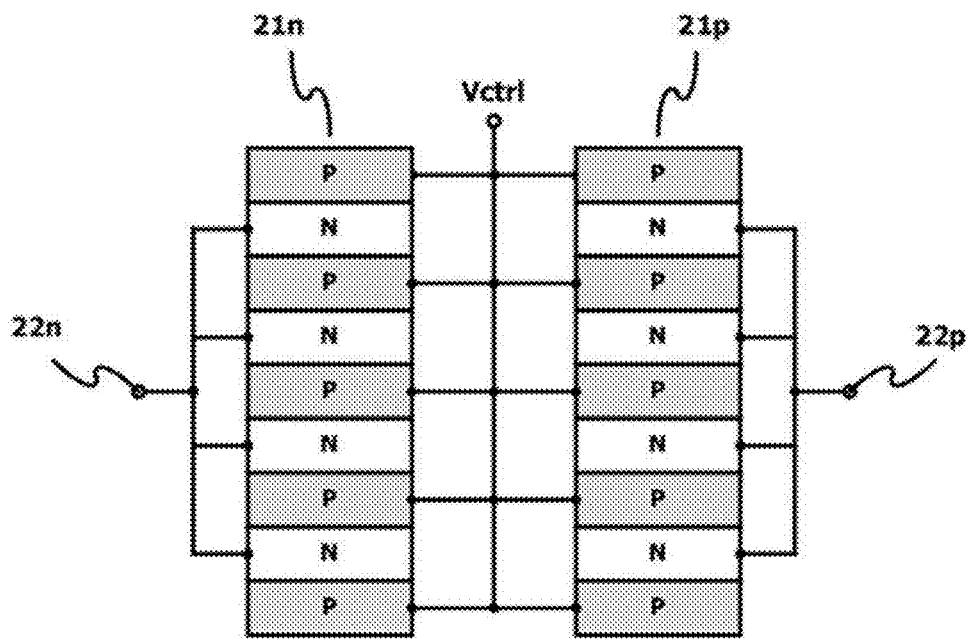
FIG. 4 illustrates a concept of an actual layout of a variable capacitor formed by using diodes shown in FIG. 2.

When this varactor layout structure shown in FIG. 6 is compared with the varactor layout structure shown in FIG. 4 according to Related Art, the case of FIG. 6 indicates a case that two diodes 21n and 21p shown in FIG. 4 share the P-type semiconductor region. Accordingly, it is possible to minimize a metal line for interconnecting the diodes 21n and 21p to each other at a virtual ground node region to which the control voltage Vctrl is connected.

When such an interconnection portion using a metal line is minimized at a virtual ground portion, a parasitic capacitance component generated in the metal line is fundamentally removed, and a noise component and a power leakage generated in a resistance component are removed. Accordingly, it is possible to improve a performance of a general integrated circuit. Further, the P-type semiconductor regions that separately exist in the two diodes 21n and 21p are combined as one P-type semiconductor to be shared by the diodes 21n and 21p. Accordingly, the utilization of the P-type semiconductor is maximized, and resultantly an entire area of the varactor on the integrated circuit can be reduced.

FIG. 7 illustrates a case that a P-type semiconductor is added into an outermost of the variable capacitor shown in FIG. 6. Specifically, a variable capacitor structure shown in FIG. 7 is obtained by adding P-type semiconductors into the outermost of the variable capacitor that N-type semiconductors exist at an outermost in the structure shown in FIG. 6. Similar to other P-type semiconductors, the control voltage Vctrl is also applied to the added P-type semiconductors in FIG. 7. Since the variable capacitor structure of FIG. 7 has the same basic configuration and principle as that of the FIG. 6.

FIG. 6 and FIG. 7 illustrate configurations for minimizing interconnection lines of the P-type semiconductor by using the PN junction. When positions of the N-type and P-type semiconductors are switched in the drawings, they may be changed to configurations for minimizing interconnection lines of the N-type semiconductors. Detailed structure and principle thereof are substantially the same as those of FIG. 6 and FIG. 7, and thus detailed descriptions are omitted. However, a configuration of FIG. 8 as a representative modification will be described.

FIG. 8 illustrates a modification of the first exemplary embodiment of the present invention. The configuration of FIG. 8 corresponds to that of FIG. 7(b). Referring to FIG. 8, the variable capacitor 100b includes a plurality of P-type semiconductors P which are separately arranged and at least one N-type semiconductor N bonded between the P-type semiconductors P. The N-type semiconductor N respectively constitutes first and second PN junctions together with the P-type semiconductors P contacting a lower portion and an upper portion of the N-type semiconductor N.

In this case, the P-type semiconductors are divided into first P-type semiconductors and second P-type semiconductors. Among the P-type semiconductors P, the first P-type semiconductors disposed at odd-th ((2n−1)-th; n being a positive integer) positions are connected with a first signal line, and the second P-type semiconductors disposed at even-th (2n-th; n being a positive integer) positions are connected with a second signal line.

The first P-type semiconductors are connected with each other through first metal lines to be connected with the node 1, the second P-type semiconductor are connected with each other through second metal lines to be connected with the node 2, and the N-type semiconductors are connected with each other through third metal lines to be connected with a control voltage applying terminal (not illustrated).

In the structure of FIG. 8, N-type semiconductors are respectively additionally bonded to outermost of the P-type semiconductors to receive the control voltage Vctrl like other N-type semiconductors. Although not shown, it may be realized as a variable capacitor in a form in which P-type semiconductors exist at an outermost thereof by excluding the N-type semiconductors from the outermost shown in FIG. 8.

Unlike FIG. 7(b), in the variable capacitor of FIG. 8, a portion connected with the source voltage VDD is formed by using a P-type semiconductor which is an anode of a diode, and a portion at which a virtual ground is formed is formed by using a N-type semiconductor which is a cathode of a diode. The variable capacitor of FIG. 8 is appropriate for a case that the control voltage Vctrl is generated to be higher than the source voltage VDD.

Next, a layout of a variable capacitor realized by using a MOSFET will be described. FIG. 9 and FIG. 10 illustrate layouts of variable capacitors realized by using MOSFETs according to a second exemplary embodiment of the present invention.

A variable capacitor 200a shown in FIG. 9 is realized by using a PMOS transistor. In this case, a source region and a drain region are formed of P-type semiconductors with a gate therebetween. A variable capacitor 200b shown in FIG. 10 is realized by using a NMOS transistor. In this case, a source region and a drain region are formed of N-type semiconductors with a gate therebetween.

Fundamental constituting principles of FIG. 9 and FIG. 10 are the same except for the described difference. Accordingly, the case of FIG. 9 will be representatively described hereinafter.

The variable capacitor 200a shown in FIG. 9 has a simplest structure according to the second exemplary embodiment of the present invention in which two transistors (a first PMOS and a second PMOS) are coupled to each other in a form of sharing a drain region (or source region). The variable capacitor shown in FIG. 9(b) has a structure expanded from that of FIG. 9(a).

Referring to FIG. 9, the variable capacitor 200b has a structure in which a first transistor (first PMOS) and a second transistor (second PMOS) are coupled to each other. To that end, the variable capacitor 200b includes a plurality of P-type semiconductors (white region) and a plurality of gate regions G (shadowed regions) disposed between the P-type semiconductors.

The P-type semiconductors which are separately arranged correspond to source regions S or drain regions D and receive the control voltage Vctrl from an outside. The control voltage Vctrl is for adjusting a capacitance, and a gate capacitance may be varied depending on magnitudes of the source voltage VDD applied to the gate region G and the control voltage Vctrl applied to the drain and the source of the PMOS.

Herein, the gate regions G are divided into first gate regions and second gate regions. Among the gate regions G, the first gate regions (pale shadow) disposed at odd-th ((2n−1)-th; n being a positive integer) positions correspond to a gate of a first transistor (a first PMOS), and are connected with a first line (not illustrated) which is one of the differential signal lines through the node 1. Further, among the gate regions G, the second gate regions (dark shadow) disposed at an even-th (2n-th) position correspond to a gate of a second transistor (a second PMOS), and are connected with a second line (not illustrated) which is one of the differential signal lines through the node 2.

Herein, the first gate regions are connected with each other through the first metal line 1 to be connected with the node 1, and the second gate regions are connected with each other through the second metal line 2 to be connected with the node 2. Further, the P-type semiconductors are connected with each other through the third metal line 3 to be connected with a control voltage applying terminal.

In the configuration of FIG. 9, for the first and second transistors (the first PMOS and the second PMOS), the source region and the drain region are formed in positions opposite to each other based on the gate region thereof and in a form of sharing the source region or the drain region through the semiconductors between the first and second gate regions.

In FIG. 9, dispositions of source regions and drain regions corresponding to positions of the P-type semiconductor are divided into two cases, which are separately illustrated by using parentheses. This will be simply described with reference to FIG. 9(*a*) hereinafter.

In FIG. 9(*a*), when a P-type semiconductor disposed at the top is the source S, a next P-type semiconductor is the drain D, and a next P-type semiconductor is the source S. Accordingly, the two transistors (the first PMOS and the second PMOS) share the drain D through one P-type semiconductor. Further, mutual connection of these three P-type semiconductors indicates interconnecting the sources and the drains of the first PMOS and the second PMOS.

In brief, when P-type semiconductors disposed at an upper side and a lower side with respect to the gate region of the first transistor (first PMOS) respectively are the source region S and the drain region D, P-type semiconductors disposed at an upper side and a lower side with respect to the gate region of the second transistor (second PMOS) respectively are the drain region D and the source region S. In this case, the two transistors share the drain region D.

In contrast, as indicated by parentheses, when P-type semiconductors disposed at an upper side and a lower side with respect to the gate region of the first transistor (first PMOS) respectively are the drain region D and the source region S, P-type semiconductors disposed at an upper side and a lower side with respect to the gate region of the second transistor (second PMOS) respectively are the source region S and the drain region D. In this case, the two transistors shares the source region S. This is also true of the case of FIG. 9(*b*), which is an expanded example of FIG. 9(*a*).

Figure 5:
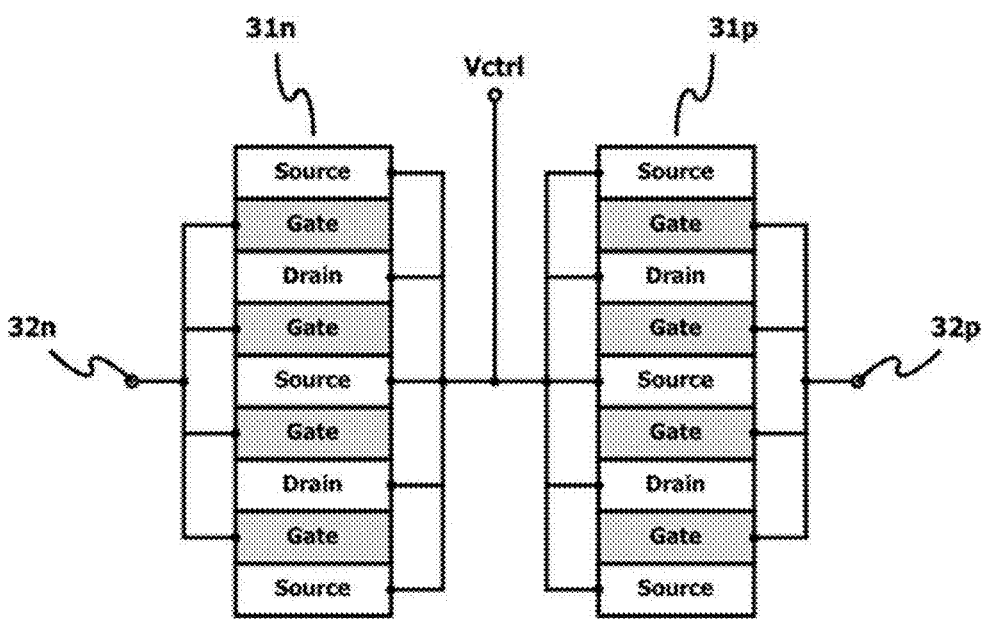
FIG. 5 illustrates a concept of an actual layout of a variable capacitor formed by using PMOSs shown in FIG. 3.

When the layout structure of the variable capacitor shown in FIG. 9 is compared with that of FIG. 5 according to Related Art, spaces between the drains and the sources of the two PMOSs 31*n* and 31*p* shown in FIG. 5 are shared in the case of FIG. 9. These sources and drains are the virtual ground nodes to which the control voltage Vctrl is connected in FIG. 5. In the case of FIG. 9, since the spaces therebetween are shared, it is possible to minimize metal lines for interconnecting the two PMOSs 31*n* and 31*p* to each other.

As such, when an interconnection portion using the metal lines is minimized at the virtual ground portion, the parasitic capacitance component generated at the metal lines is fundamentally removed, and noise components and power leakages generated in resistance components are removed. Accordingly, it is possible to improve a performance of a general integrated circuit. Further, the drain and source that separately exist in the two PMOSs 31*n* and 31*p* are combined as one P-type semiconductor to be shared by the PMOSs 31*n* and 31*p*. Accordingly, the utilization of the drain and source regions is maximized, and resultantly an entire area of the variable capacitor on the integrated circuit can be reduced.

As described above, with the variable capacitor applied to the integrated circuit of the differential structure according to the exemplary embodiments of the present invention, it is possible to reduce an area required for the integrated circuit and suppress a parasitic capacitance component from being generated by forming connection areas of virtual ground portions at which two variable capacitors formed on the integrated circuit of the differential structure to be symmetrical to each other are met to be shared. Accordingly, a production cost thereof can be reduced, and noise generation of the integrated circuit using the variable capacitor can be minimized.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A variable capacitor connected between first and second signal lines which are differential signal lines included in an integrated circuit of a differential structure and including first and second transistors coupled thereto, the variable capacitor comprising:

a plurality of semiconductors separately arranged to receive a control voltage from an outside, and corresponding to a source region or a drain region; and a plurality of gate regions disposed between the semiconductors, wherein, among the gate regions, first gate regions corresponding to (2n−1)-th (n being a positive integer) serve as a gate of the first transistor and are connected with the first signal, and second gate regions corresponding to 2n-th serve as a gate of the second transistor and are connected with the second signal line, and the first and second transistors are formed such that positions of the source region and the drain region are opposite to each other based on the gate region thereof, and share source regions or drain regions through a semiconductor between the first and second gate regions.

2. The variable capacitor of claim 1, wherein the first gate regions are connected with each other through first metal lines, the second gate regions are connected with each other through second metal lines, and the semiconductors are connected with each other through third metal lines.

3. The variable capacitor of claim 1, wherein, when the first and second transistors are formed of PMOSs, the semiconductors are formed as P-type semiconductors, and when the first and second transistors are formed of NMOSs, the semiconductors are formed as N-type semiconductors.

4. The variable capacitor of claim 1, wherein, when semiconductors disposed at an upper side and a lower side with respect to the first gate region of the first transistor respectively are the drain region and the source region, semiconductors disposed at an upper side and a lower side with respect to the second gate region of the second transistor respectively are the source region and the drain region, and when semiconductors disposed at an upper side and a lower side with respect to the first gate region of the first transistor respectively are the source region and the drain region, semiconductors disposed at an upper side and a lower side with respect to the second gate region of the second transistor respectively are the drain region and the source region.

5. The variable capacitor of claim 2, wherein, when the first and second transistors are formed of PMOSs, the semiconductors are formed as P-type semiconductors, and when the first and second transistors are formed of NMOSs, the semiconductors are formed as N-type semiconductors.

* * * * *